United States Patent
Guo et al.

(10) Patent No.: US 10,395,718 B2
(45) Date of Patent: *Aug. 27, 2019

(54) CHARGE MIRROR-BASED SENSING FOR FERROELECTRIC MEMORY

(71) Applicant: Micron Technology, Inc., Boise, ID (US)

(72) Inventors: Xinwei Guo, Folsom, CA (US); Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/189,425

(22) Filed: Nov. 13, 2018

(65) Prior Publication Data

US 2019/0108867 A1 Apr. 11, 2019

Related U.S. Application Data

(60) Continuation of application No. 15/847,583, filed on Dec. 19, 2017, now Pat. No. 10,170,173, which is a division of application No. 15/173,310, filed on Jun. 3, 2016, now Pat. No. 9,881,661.

(51) Int. Cl.
*G11C 11/22* (2006.01)

(52) U.S. Cl.
CPC ........ *G11C 11/2273* (2013.01); *G11C 11/221* (2013.01); *G11C 11/2275* (2013.01)

(58) Field of Classification Search
CPC ........... G11C 11/2273; G11C 11/2275; G11C 11/221
See application file for complete search history.

(56) References Cited

U.S. PATENT DOCUMENTS

| | | |
|---|---|---|
| 5,412,602 A | 5/1995 | Yero |
| 5,677,865 A | 10/1997 | Seyyedy |
| 6,288,931 B1 | 9/2001 | Kye et al. |
| 6,529,398 B1 | 3/2003 | Nair et al. |
| 6,584,007 B2 | 6/2003 | Mcclure |
| 7,269,049 B2 | 9/2007 | Shiga et al. |
| 7,778,065 B2 | 8/2010 | Lamorey et al. |
| 7,800,968 B2 | 9/2010 | Kern |
| 7,885,131 B2 | 2/2011 | Sakimura et al. |

(Continued)

OTHER PUBLICATIONS

ISA/KR, International Search Report and Written Opinion of the International Searching Authority, Int'l Appl. PCT/US2017/029099, dated Aug. 4, 2017, Korean Intellectual Property Office, Seo-gu, Daejeon, Republic of Kores, 13 pgs.

(Continued)

*Primary Examiner* — Uyen B Tran
(74) *Attorney, Agent, or Firm* — Holland & Hart LLP

(57) ABSTRACT

Methods, systems, and devices for a sensing scheme that extracts the full or nearly full remnant polarization charge difference between two logic states of a ferroelectric memory cell or cells is described. The scheme employs a charge mirror to extract the full charge difference between the two states of a selected memory cell. The charge mirror may transfer the memory cell polarization charge to an amplification capacitor. The signal on the amplification capacitor may then be compared with a reference voltage to detect the logic state of the memory cell.

20 Claims, 11 Drawing Sheets

(56) References Cited

U.S. PATENT DOCUMENTS

| | | |
|---|---|---|
| 7,933,138 B2 | 4/2011 | McAdams et al. |
| 8,588,019 B2 | 11/2013 | Kajigaya |
| 2002/0006053 A1 | 1/2002 | Murakuki |
| 2002/0085406 A1* | 7/2002 | McClure ............... G11C 29/50 |
| | | 365/145 |
| 2010/0195368 A1 | 8/2010 | Mcadams et al. |
| 2013/0308396 A1* | 11/2013 | Cho ..................... G11C 5/147 |
| | | 365/189.09 |
| 2013/0322154 A1* | 12/2013 | Youn ................. G11C 13/0002 |
| | | 365/148 |
| 2015/0016175 A1* | 1/2015 | Evans, Jr. ............ G11C 11/221 |
| | | 365/145 |

OTHER PUBLICATIONS

English Translation of Office Action issued in connection with Korean Patent Application No. 10-2018-7038121, dated May 7, 2019, 4 pgs.

* cited by examiner

CHARGE MIRROR-BASED SENSING FOR FERROELECTRIC MEMORY

CROSS REFERENCE

The present Application for Patent is a continuation of U.S. patent application Ser. No. 15/847,583 by Guo et al., entitled "Charge Mirror-Based Sensing For Ferroelectric Memory," filed Dec. 19, 2017, now U.S. Pat. No. 10,170,173, issued Jan. 1, 2019, which is a divisional of U.S. patent application Ser. No. 15/173,310 by Guo et al., entitled "Charge Mirror-Based Sensing For Ferroelectric Memory," filed Jun. 3, 2016, now U.S. Pat. No. 9,881,661, issued Jan. 30, 2018, assigned to the assignee hereof, and each of which is expressly incorporated by reference in its entirety herein.

BACKGROUND

The following relates generally to memory devices and more specifically to charge mirror-based sensing for ferroelectric memory.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. Some FeRAM sensing schemes may, however, extract only a fraction of the ferroelectric capacitor's stored charge when determining the stored logic state. This may reduce the reliability of sensing operations or may limit memory cell, or array, size reductions that could otherwise be made.

BRIEF DESCRIPTION OF THE DRAWINGS

The disclosure herein refers to and includes the following figures.

DETAILED DESCRIPTION

Figure 1:
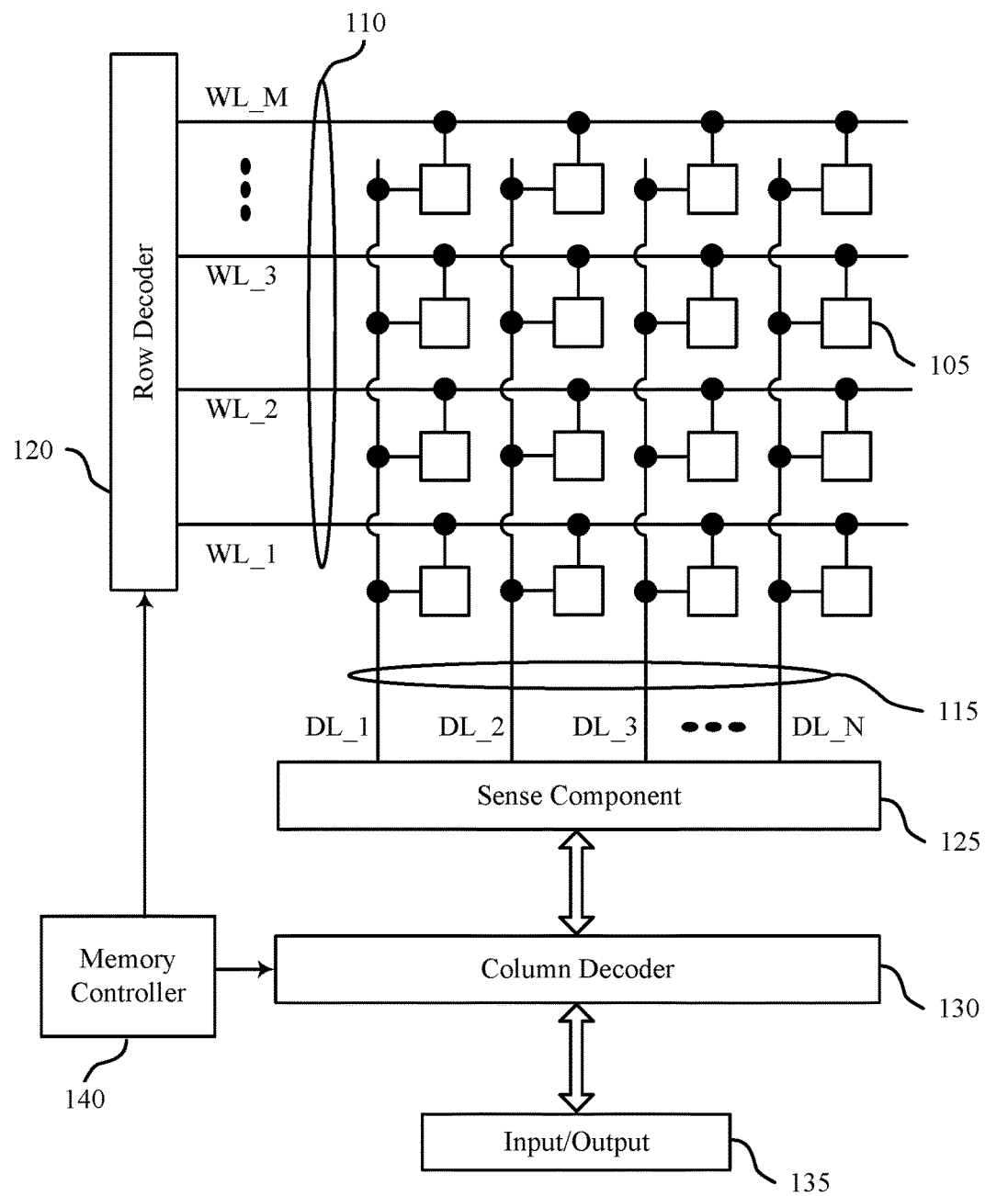
FIG. 1 illustrates an example memory array that supports a charge mirror-based sensing scheme for ferroelectric memory in accordance with various embodiments of the present disclosure.

Increased sensing reliability for memory cells may be realized with a scheme that allows a full or nearly full charge extraction from a memory cell's ferroelectric capacitor. A charge mirror may be in electronic communication with a memory cell and a sense component. During sensing, charge may flow from the memory cell to ground through the charge mirror. Simultaneously, the charge mirror may extract charge from an amplification capacitor—that is, the extracted charge from the memory cell may be mirrored to the amplification capacitor. Because the amount of charge extracted from the memory cell may depend on the memory cell's initially stored logic state, the final charge on the amplification capacitor may be a function of the memory cell's logic state. The sense component, which may be in electronic communication with the amplification capacitor, may then determine the memory cell's logic state, for example, by sensing the amplification capacitor's resulting voltage.

Some conventional ferroelectric memory sensing schemes may use DRAM-like charge sharing operations. Such sensing schemes may, however, be unable to detect the full remnant polarization charge difference between the two logic states of the memory cell. This may be due to charge sharing between the memory cell and the digit line—e.g., as charge is moved onto the digit line, the digit line's voltage increases, limiting further charge accumulation. As a result, the memory cell may be biased at a lower voltage than it is otherwise capable of, which may result in a smaller read window and may limit the scaling of the cell size and thus potential die size reduction.

As described herein, a charge transfer scheme extracts the full or substantially full remnant polarization charge difference between the two logic states. The sense scheme use a charge mirror to sense the cell polarization charge difference between the two cell states. In some examples, the charge mirror transfers the cell polarization charge to an amplification capacitor. The signal on the amplification capacitor may then be compared with a reference voltage to detect the memory cell's logic state. Such a scheme may not use high positive power supplies or negative power supplies that other sensing schemes use, which may be beneficial for reducing power consumption and die area.

The cell plate, which in some examples biases the ferroelectric capacitor of the memory cell and may be common to multiple memory cells, may be biased at a boosted voltage. The memory cell's digit line may be biased to a threshold voltage above ground through a diode-connected device, for example, an n-type field-effect transistor (FET). The charge mirror may, in some examples, include this diode-connected digit line initialization device and an additional transistor (e.g., an n-type transistor), where the gate of both transistors may be commonly-connected.

The charge mirror may convey or mirror the extracted polarization charge from the memory cell to an amplification capacitor. A sense component, such as a sense amplifier, may then compare the signal with a reference signal to generate the output. In some examples, the charge mirror ratio—e.g., the ratio of the charge extracted from the memory cell relative to the charge extracted from the amplification capacitor—may be designed for different chip architectures to improve power use, die size, and noise immunity. For example, the charge mirror ratio may be set based on the ratio of the channel widths of the charge mirror transistors. The capacitance of the amplification capacitor may also be designed to improve performance of a device. In some examples, the amplification capacitor may be a dielectric capacitor or may be a parasitic capacitance associated with a conductive line connecting the charge mirror to the sense component.

Features of the disclosure introduced above are further described below in the context of a memory array. Specific examples are then described for a charge mirror-based sensing scheme for ferroelectric memory. These and other features of the disclosure are further illustrated by and described with reference to apparatus diagrams, system diagrams, and flowcharts that relate to a charge mirror-based sensing scheme.

FIG. 1 illustrates an example memory array 100 that supports a charge mirror-based sensing scheme for ferroelectric memory in accordance with various embodiments of the present disclosure. Memory array 100 may also be referred to as an electronic memory apparatus. Memory array 100 includes memory cells 105 programmable to store different states. Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively. Memory cells 105 include a capacitor with a ferroelectric material. Ferroelectric materials have a spontaneous electric polarization—i.e., they have a non-zero polarization in the absence of an electric field. Some details and advantages of a ferroelectric memory cell 105 are discussed below. Different levels of charge of a ferroelectric capacitor may represent different logic states.

Operations such as reading and writing may be performed on memory cells 105 by activating or selecting the appropriate access line 110 and digit line 115. Access lines 110 may also be referred to as word lines 110, and digit lines 115 may also be referred to as bit lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, degenerately doped semiconductors, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 150 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Row decoder 120 may also be referred to as a word line driver. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed. In some examples, the charge mirror may be activated based on row decoder 120 or column decoder 130 receiving an address.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. Digit line 115 may be in electronic communication with a charge mirror (not shown). The charge extracted from the memory cell 105 may be virtually grounded but the charge mirror may simultaneously extract a charge from a second capacitor, for example, an amplification capacitor. Such a scheme may extract the full charge from the memory cell 105. Sense component 125 may compare the resulting voltage of the amplification capacitor to a reference voltage (not shown) in order to determine the stored state of the memory cell 105. For example, if the amplification capacitor has a higher voltage than the reference voltage, then sense component 125 may determine that the stored state in memory cell 105 was a logic 0 and vice versa. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

In some examples, sensing a memory cell 105 may degrade or destroy its originally stored logic state, and a write-back operation may be performed to re-program the original logic state. In some examples, the charge mirror may be electrically isolated from the memory cell 105 during the write-back operation, and the sense component 125 output may be electrically connected to the digit line 115 by closing a switch. This is discussed in more detail below.

Some memory architectures, such as DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures. The charge mirror sensing scheme may extract the full or substantially full charge of the memory cell 105, which may enable further reduction in the size of the memory cells 105 and increase their reliability.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100, for example, by activating the charge mirror or closing the write-back switch. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
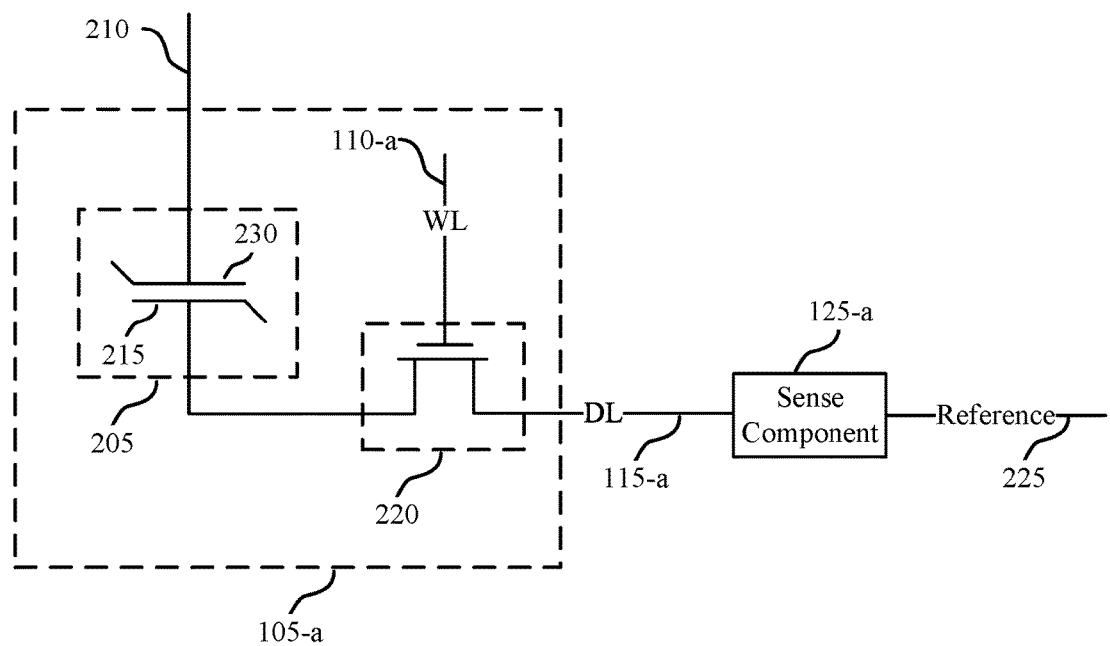
FIG. 2 illustrates an example circuit that supports a charge mirror-based sensing scheme for a ferroelectric memory cell in accordance with various embodiments of the present disclosure.

FIG. 2 illustrates an example circuit 200 that includes a memory cell 105 and supports a charge mirror-based sensing scheme for ferroelectric memory in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference 225 signal. In the example of FIG. 2, cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a. In an alternative embodiment, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is connected to a virtual grounded through a charge mirror (not shown). Biasing plate line 210 may result in a voltage difference (e.g., plate line 210 voltage minus digit line 115-a voltage) across capacitor 205. In response to the voltage difference, charge may flow through the charge mirror, which mirrors the extracted charge to an amplification capacitor. The magnitude of the extracted change may depend on the initial state of capacitor 205—e.g., whether the initial state stored a logic 1 or a logic 0. Operation of memory cell 105-*a* by varying the voltage to cell plate 230 may be referred to as "moving cell plate."

Sense component 125-*a* may include various transistors or amplifiers to detect and amplify a difference in signals, which may be referred to as latching. Sense component 125-*a* may include a sense amplifier that receives and compares the voltage of an amplification capacitor and reference 225 signal, which may be a reference voltage. The sense amplifier output may be driven to the higher (e.g., a positive) or lower (e.g., negative or ground) supply voltage based on the comparison. For instance, if the amplification capacitor has a higher voltage than reference 225 signal, then the sense amplifier output may be driven to a positive supply voltage. In some cases, the sense amplifier may additionally drive the amplification capacitor to the supply voltage. Sense component 125-*a* may then latch the output of the sense amplifier and/or the voltage of amplification capacitor, which may be used to determine the stored state in memory cell 105-*a*, e.g., logic 0. Alternatively, if the amplification capacitor has a lower voltage than reference 225 signal, the output of sense component 125-*a* may be driven to a negative or ground voltage. Sense component 125-*a* may similarly latch the sense amplifier output to determine the stored state in memory cell 105-*a*, e.g., logic 1. The latched logic state of memory cell 105-*a* may then be output, for example, through column decoder 130 as output 135 with reference to FIG. 1.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high.

FIG. 3A and FIG. 3B illustrate examples of non-linear electrical properties with hysteresis curves 300-*a* (FIG. 3A) and 300-*b* (FIG. 3B) for a memory cell that supports a charge mirror-based sensing scheme for ferroelectric memory in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300. In some examples, a memory array may only use positive voltages during its operation.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1 (the logic values of the respective charge states may be reversed without loss of understanding).

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305 and 310 may also be referred to as the remnant polarization (Pr) values, i.e., the polarization—and thus the respective charge—that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor as discussed with reference to FIG. 2. Although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-c depend on a number of factors, including the specific sensing scheme and circuitry. For example, charge states 305-c and 310-c may be co-located on the hysteresis curve at voltage 355 (although they are depicted apart for clarity in FIG. 3). Thus, the change in charge of the ferroelectric capacitor depends on the initial logic state. That is, the charge difference between charge states 305-b and 305-c is less than the difference between charge states 310-b and 310-c. Due to the charge mirror, the change in charge is mirrored (to a multiplicative factor) to an amplification capacitor used for sensing.

Such a sensing scheme may use the full charge difference between the logic states to sense the memory cell. For example, the change in charge for a logic 0, which may be referred to as the linear charge change of the memory cell, $Q_{linear}$, may be equal to the quantity (charge state 305-c – charge state 305-b). The change in charge for a logic 1, $Q_{NL}$, may be equal to the quantity (charge state 310-c – charge state 310-b). When charge states 305-c and 310-c are co-located (i.e., are equal in value), then the net charge used for sensing is $Q_{NL} - Q_{linear}$ = (charge state 305-b – charge state 310-b), which is equal to twice the remnant polarization charge, $2Q_{Pr}$.

The difference between the applied voltage, voltage 335, and the resulting cell voltage, voltage 355, may be equal to a threshold voltage of a transistor. For example, the plate line voltage may be boosted relative to the memory cell's bias capability, which may be represented as voltage 355. The boosted plate voltage may account for activating the transistor within the charge mirror. That is, some of the applied voltage 335 may be used to activate the transistor of the charge mirror and, in order to extract the full charge from the memory cell, the applied voltage 335 may be boosted to accommodate the threshold voltage drop across the charge mirror transistor.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

Figure 4:
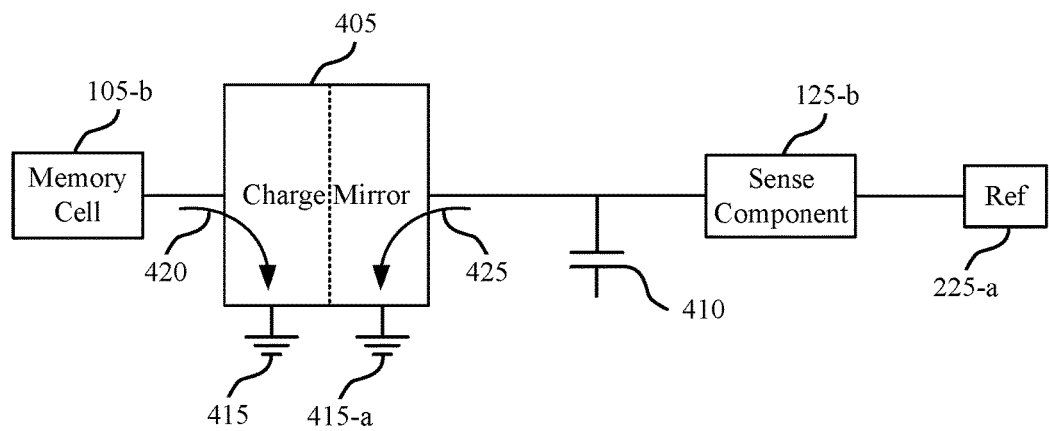
FIG. 4 illustrates an example circuit that supports a charge mirror-based sensing scheme for a ferroelectric memory cell in accordance with various embodiments of the present disclosure.

FIG. 4 is an example circuit 400 that includes a memory cell 105 and supports a charge mirror-based sensing scheme for ferroelectric memory in accordance with various embodiments of the present disclosure. Circuit 400 includes memory cell 105-b and sense component 125-b, which may be examples of a memory cell 105 and a sense component 125 with reference to FIGS. 1 and 2. Circuit 400 also includes reference 225-a signal, which may be an example of reference 225 with reference to FIG. 2. Circuit 400 also includes a charge mirror 405, amplification capacitor 410, and virtual grounds 415 and 415-a.

During a sensing operation of memory cell 105-b, charge may flow (represented by charge flow 420) from memory cell 105-b into virtual ground 415 through charge mirror 405. In response to charge flow 420, charge mirror 405 may cause charge to flow (represented by charge flow 425) from amplification capacitor 410 to virtual ground 415-a through charge mirror 405. For example, an initial charge may be stored in amplification capacitor 410 before the sensing operation and during sensing, charge mirror 405 extracts charge from amplification capacitor 410. In some cases, the charge may flow in the opposite direction.

As discussed above, the amount of charge extracted from memory cell 105-b may depend on its stored logic state. As a result, the amount of charge extracted from amplification capacitor 410 may depend on the stored logic state of memory cell 105-b. The voltage of amplification capacitor 410 may thus be one of two values. Sense component 125-b may compare the voltage of amplification capacitor 410 to a reference value, for example, reference 225-a voltage, and may thus determine the stored logic state of memory cell 105-b.

Thus, circuit 400 may include ferroelectric memory cell 105-b, charge mirror 405 in electronic communication with ferroelectric memory cell 105-b, and amplification capacitor 410 in electronic communication with charge mirror 405. Memory cell 105-b may be selected for a sensing operation and at least a portion of a charge stored in memory cell 105-b may be extracted through charge mirror 405 based on selecting memory cell 105-b. A portion of a charge stored in amplification capacitor 410 may be extracted through charge mirror 405 based on the extraction of the portion of the charge stored in memory cell 105-b. Sense component 125-b may compare a voltage of amplification capacitor 410 to reference 225-a voltage, where the voltage of amplification capacitor 410 is based on the portion of the charge extracted from amplification capacitor 410.

Figure 5:
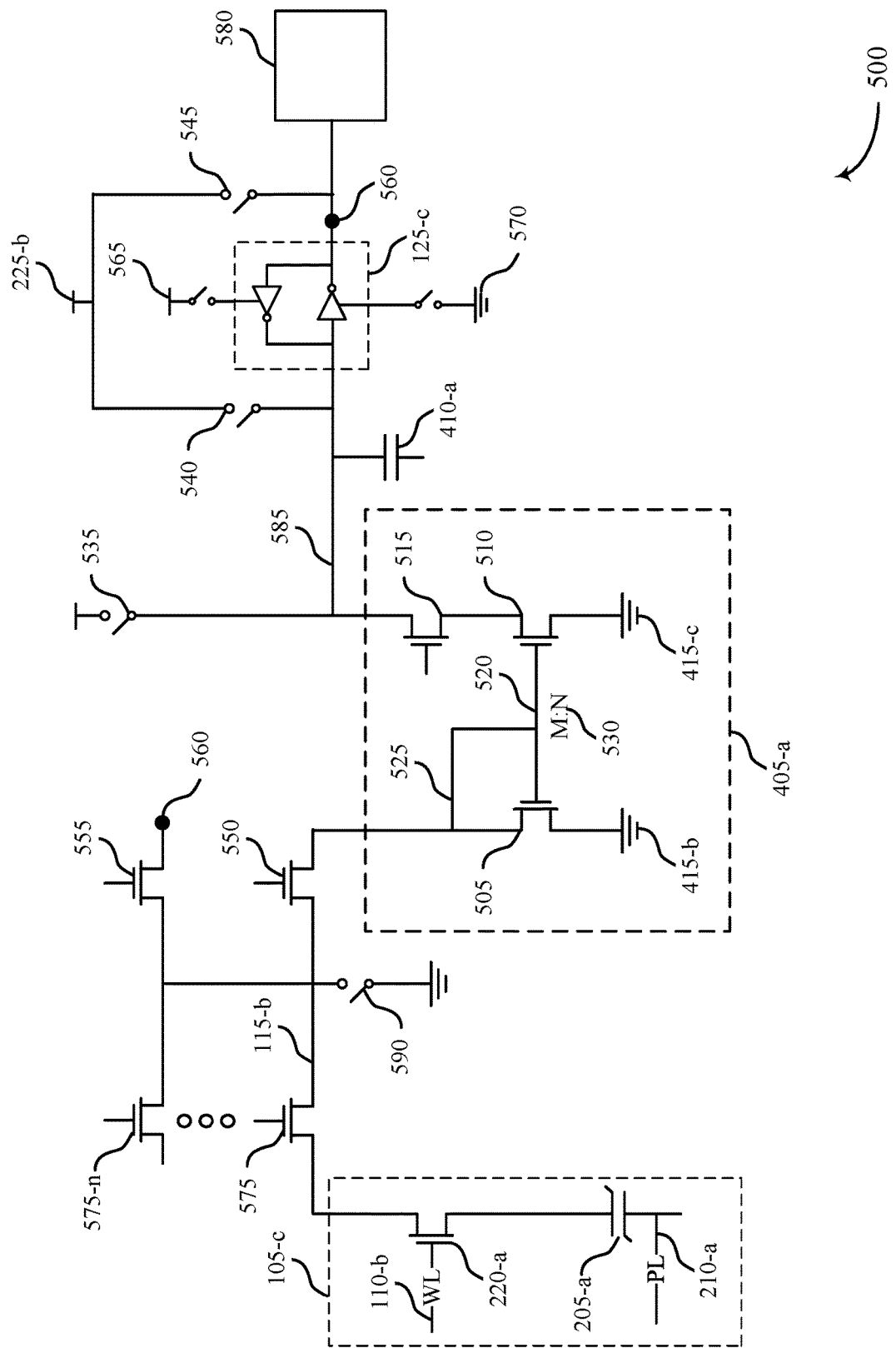
FIG. 5 illustrates an example circuit that supports a charge mirror-based sensing scheme for a ferroelectric memory cell in accordance with various embodiments of the present disclosure.

FIG. 5 is an example circuit 500 that supports a charge mirror-based sensing scheme for ferroelectric memory in accordance with various embodiments of the present disclosure. Circuit 500 includes memory cell 105-c, word line 110-b, digit line 115-b, and sense component 125-c, which may be examples of a memory cell 105, word line 110, digit line 115, and a sense component 125 with reference to FIG. 1, 2, or 4. Circuit 500 also includes capacitor 205-a, plate line 210-a, selection component 220-a, and reference 225-b voltage, which may be examples of a capacitor 205, plate line 210, selection component 220, and reference 225 with reference to FIG. 2 or 4. Circuit 500 also includes charge mirror 405-a, amplification capacitor 410-a, and virtual grounds 415-b and 415-c, which may be examples of a charge mirror 405, amplification capacitor 410, and virtual ground 415 with reference to FIG. 4. Amplification capacitor 410-a may be a dielectric capacitor or a parasitic capacitance associated with conductive line 585.

Memory cell 105-c, which may be a ferroelectric memory cell 105, may be in electronic communication with charge mirror 405-a, and amplification capacitor 410-a may be in electronic communication with charge mirror 405-a. Charge mirror 405-a may include various transistors configured to mirror charge flow from one side of circuit 500 to another. Charge mirror 405-a includes transistors 505 and 510, as well as conductive lines 520 and 525. Transistor 505 may share its gate with transistor 510, that is, the gates of transistors 505 and 510 may be in electronic communication with one another. Thus, charge mirror 405-a may include a first transistor and a second transistor, where a gate of the first transistor and a gate of the second transistor are commonly connected.

Further, the shared gates of transistors 505 and 510 may be in electronic communication with a first terminal of transistor 505, which is in electronic communication with digit line 115-c, through conductive line 525. That is, a first terminal of the first transistor may be in electronic communication with memory cell 105-c, and the first terminal of the first transistor may be in electronic communication with the gate of the first transistor. A second terminal of transistor 505 may be in electronic communication with virtual ground 415-b, that is, a second terminal of the first transistor may be in electronic communication with virtual ground. Transistor 510 may be in electronic communication with virtual ground 415-c and amplification capacitor 410-a through conductive line 585. For instance, a first terminal of the second transistor may be in electronic communication with amplification capacitor 410-a, and a second terminal of the second transistor may be in electronic communication with virtual ground 415-c.

In the example of FIG. 5, charge mirror 405-a has a mirror ratio 530, which is a proportionality factor that affects the amount of charge mirrored by charge mirror 405-a. For example, the charge extracted from amplification capacitor 410-a may be equal to the charge extracted from memory cell 105-c multiplied by mirror ratio 530. Mirror ratio may be a ratio of the channel widths of transistors 505 and 510. In other words, mirror ratio 530 of charge mirror 405-a may be based on a channel width ratio of the first transistor and the second transistor. For example, transistor 505 may have a channel width, M, and transistor 510 may have a channel width, N, and the mirror ratio may be M:N. By varying the transistor channel width, mirror ratio 530 may be optimized accordingly. In some cases, mirror ratio 530 may be 2:1.

As mentioned, the first terminal of transistor 505 may be in electronic communication with memory cell 105-c through digit line 115-b. In some cases, read isolation device 550 (e.g., a switch or transistor) may be in series with digit line 115-b and positioned between memory cell 105-c and transistor 505. That is, a first isolation device may be positioned between and in electronic communication with ferroelectric memory cell 105-c and charge mirror 405-a. During a sense operation, read isolation switch may be closed to electrically connect memory cell 105-c to charge mirror 405-a. In some examples, read isolation device 550 is a transistor. For instance, it may be an n-type transistor and it may be closed by applying a positive voltage with a magnitude equal to or greater than the threshold voltage of the transistor. In some examples, read isolation device 550 may be closed based on a memory controller 140 or row decoder 120 receiving a row address.

In some examples, charge mirror 405-a also includes transistor 515, which may be in electronic communication with and positioned between transistor 510 and sense component 125-c. Thus, transistor 515 may be a second isolation device positioned between and in electronic communication with sense component 125-c and charge mirror 405-a. Transistor 515 may function as a cascode device that limits the difference between the voltage drops across transistors 505 and 510 (the voltage drop across the transistor's source and drain, $V_{ds}$). For example, the mirror accuracy may be important for extracting the full remnant polarization charge difference of memory cell 105-c. Cascode device 515 may reduce the difference between Vas of each transistor by limiting the maximum Vas on transistor 510 so that charge mirror error is minimized. Thus, cascode device 515 may be the second isolation device and may also be a transistor of charge mirror 405-a. With cascode device 515 located on the mirror side (amplification capacitor 410-a side) and read isolation device 550 on the source side (memory cell 105-c side), charge mirror 405-a may see low voltages during all memory cell operations (e.g., sense, write back, and program). High matching accuracy transistors, for example, thin oxide devices, can be used to further improve mirror accuracy.

Charge mirror 405-a may be in electronic communication with sense component 125-c through conductive line 585. Amplification capacitor 410-a and precharge switch 535 may be in electronic communication with conductive line 585. Precharge switch 535 may be in electronic communication with a voltage source and may be operated to charge amplification capacitor 410-a during the sensing operation. For example, amplification capacitor 410-a may be charged to an initial voltage, $V_{int}$, by closing precharge switch 535 before memory cell 105-c is selected. In some cases, precharge switch 535 may be a transistor, for example, an n-type transistor.

Initially, during sensing for instance, a voltage may be applied to the cell plate using plate line 210-a. Word line 110-b may be off (i.e., selection component 220-a may be deactivated and capacitor 205-a may be isolated from digit line 115-b), and digit line 115-b is biased to the threshold voltage of transistor 505, $V_{th}$, higher than ground. The voltage of plate line 210-a may be boosted relative to the voltage needed to extract the full charge from ferroelectric capacitor 205-a, as discussed with reference to FIG. 3. For example, the voltage of plate line 210-a may be $V_{th}$ higher than the maximum cell bias capability, Vice", such that $$V_{plate}=V_{cell}+V_{th}.$$

After applying the plate voltage, word line 110-b may be activated to apply a voltage to selection component 220-a to electrically connect capacitor 205-a to digit line 115-b. The charge of memory cell 105-c flows to virtual ground 415-b through transistor 505 of charge mirror 405-a, which mirrors the extracted charge of memory cell 105-c to amplification capacitor 410-a. For example, amplification capacitor 410-a may be initially charged by a positive power supply voltage, as described above, during digit line 115-b initialization, and charge mirror 405-a may extract the stored charge of amplification capacitor 410-a.

Figure 3:
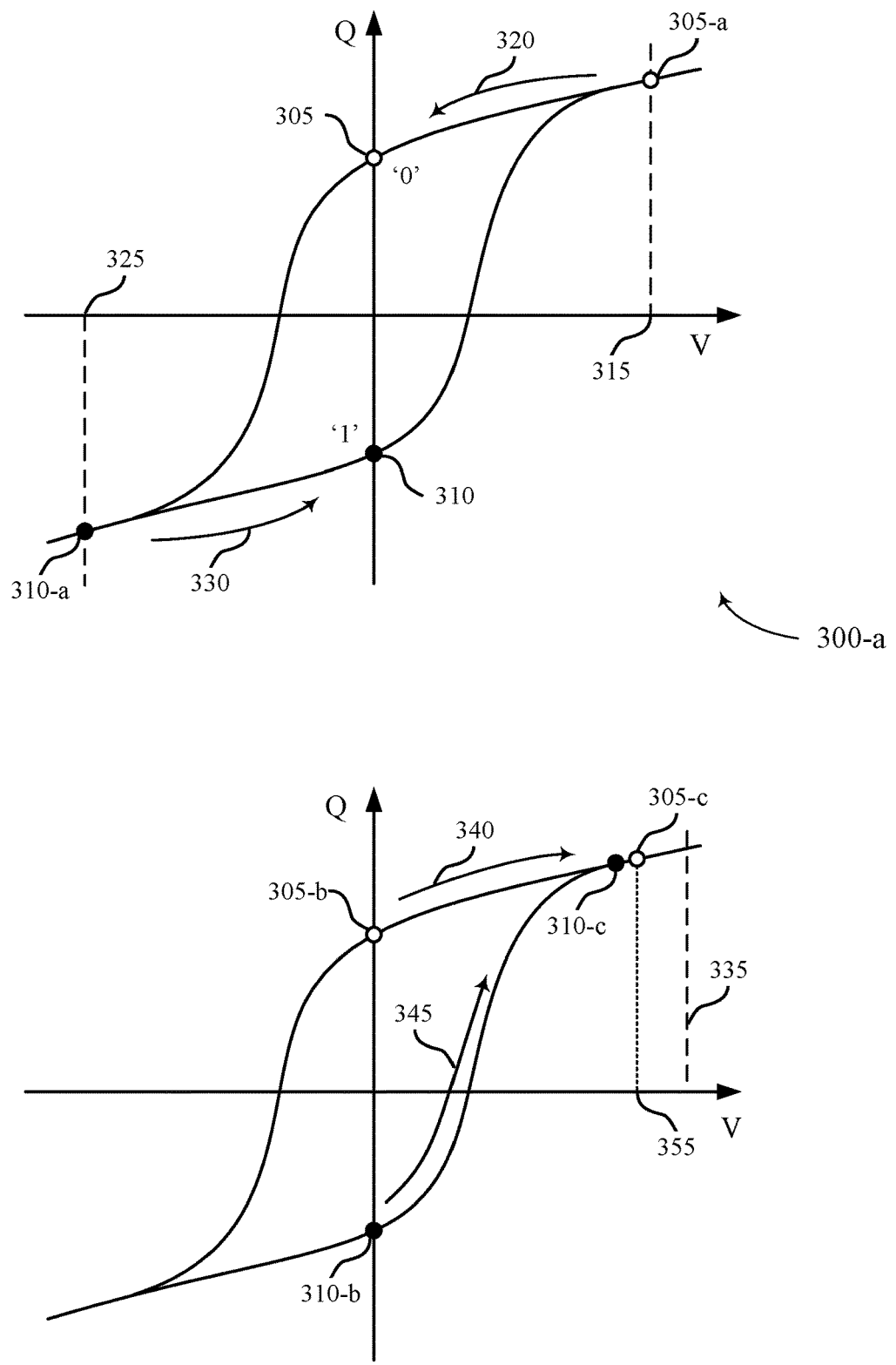
FIG. 3 illustrates example hysteresis plots for a ferroelectric memory cell that supports a charge mirror-based sensing scheme in accordance with various embodiments of the present disclosure.

The amount of extracted charge depends on the initial polarization state of memory cell 105-c, that is, its logic state. As described above, if the logic state of memory cell 105-c is initialized with the same voltage polarity as the read bias condition (e.g., with reference to FIG. 3, logic 0 and a positive voltage 335), the charge extracted from the amplification capacitor, $Q_1$, is $$Q_1=R*Q_{linear},$$

where R is mirror ratio 530 and $Q_{linear}$ is the linear charge change of memory cell 105-c with the biasing voltage as described in FIG. 3.

If memory cell 105-c is initialized with the opposite voltage polarity as the read bias condition (e.g., with reference to FIG. 3, logic 1 and a positive voltage 335), the charge extracted from amplification capacitor is:

$$Q_2=R*(Q_{2Pr}+Q_{linear}),$$

where $Q_{2Pr}$ is the remnant polarization charge difference between the two cell states (e.g., quantity (charge state 305–charge state 310) as described with reference to FIG. 3).

The charge difference seen by the amplification capacitor for the two cell states, Q, is $$Q=Q_2-Q_1=R*Q_{2Pr}.$$

Thus, the sensing scheme uses the full (or nearly or substantially full) charge difference between the two logic states. Moreover, the difference can be amplified by mirror ratio 530, which may further improve sensing operations.

The sensing scheme may use virtual grounds 415-b and 415-c to sink the charge; thus, in some cases, no negative power supply is used, which may be in contrast to other sensing schemes. The signal (e.g., a voltage) developed at amplification capacitor 410-a is compared with a reference (e.g., reference 225-*b* voltage) by sense component 125-*c* to determine and output the stored logic state of memory cell 105-*c*.

In some examples, mirror ratio 530 may be chosen based on the capacitance of the amplification capacitor, C, in order to achieve the best read window. A mirror ratio, RRw, for such a read window may be given by $$R_{RW} = \frac{C * V_{init}}{(Q_{2Pr} + Q_{linear})}.$$

Reference 225-*b* voltage may be supplied to sense component 125-*c* through reference switch 545. For example, by closing reference switch 545, reference 225-*b* voltage may be coupled to sense component 125-*c*. Thus, a reference component may be in electronic communication with sense component 125-*c*, where the reference component comprises a node in electronic communication with a voltage source, such as reference 225-*b*.

Sense component 125-*c* may be operated with sense component supply voltage 565 and sense component ground 570, each of which may be connected to sense component 125-*c* through a switching component. In some examples, sense component 125-*c* may be in electronic communication with other components 580, which may be a charge mirror 405, memory cells 105, or both. If sense component 125-*c* is performing a sense operation of a memory cell 105 in other components 580, reference switch 540 may supply reference 225-*b* voltage to sense component 125-*c*.

The capacitance of amplification capacitor 410-*a* may be designed based on multiple aspects of the memory array design. In some cases, the capacitance may be on the order of femtofarads (fF), for example, 14.5 fF. In some examples, the capacitance value may be chosen such that the initialization charge—e.g., the charge stored on amplification capacitor 410-*a* in response to the precharge voltage—is the same as the charge extracted from the opposite polarity memory cell 105. For example, for a given initialization voltage, $V_{int}$, of amplification capacitor 410-*a*, the capacitance, C, may be $$C = \frac{Q_2}{V_{int}},$$

where $Q_2$ is defined as above. This may be the smallest capacitance value that can sense the full charge (i.e., generates the largest voltage difference between the two cell logic states). Thus, the capacitance of amplification capacitor 410-*a* may be based on a charge extracted from ferroelectric memory cell 105-*c*, mirror ratio 530 of charge mirror 405-*a*, or an initialization voltage of the amplification capacitor (e.g., voltage connected to precharge switch 535), or any combination thereof.

Amplification capacitor 410-*a* may be implemented by a dedicated dielectric capacitor or by the parasitic capacitance of conductive line 585. The parasitic capacitance may depend on physical characteristics, including the dimensions (e.g., length, cross-section) of conductive line 585. The routing of conductive line 585 may be used to design a specific capacitance value, for example, it may have a length that results in a non-negligible capacitance. Thus, the parasitic capacitor may include a parasitic capacitance of conductive line 585 between charge mirror 405-*a* and sense component 125-*c*.

Since the sense operation may be disruptive to memory cell 105-*c*, the initial logic state may be written back after sensing. In some cases, a separate write path may be used to connect sense component 125-*c* to digit line 115-*b*. Although not shown, one terminal of sense component 125-*c* (e.g., node 560) may be in electronic communication with digit line 115-*b*. Write isolation device 555 (e.g., a switch or transistor) may be in electronic communication with and positioned between sense component 125-*c* and digit line 115-*b*. Thus, a conductive path may be positioned between sense component 125-*c* and digit line 115-*b* and is in electronic communication with memory cell 105-*c*, and an isolation device may be positioned in the conductive path between digit line 115-*b* and sense component 125-*c*. During the write-back operation, write isolation device 555 may be activated to couple the output of sense component 125-*c* to digit line 115-*b*. In some examples, write isolation device 555 may be a transistor, for example, an n-type transistor.

During the write-back operation, the voltage applied to plate line 210-*a* may be lowered from the boosted voltage to the write voltage (e.g., voltage 315 with reference to FIG. 3). The read isolation device 550 may then be then turned off to isolate memory cell 105-*c* from charge mirror 405-*a*. Write isolation device 555 may be activated to enable a conductive path from sense component 125-*c* to memory cell 105-*c*. In some examples, a logic 0 may be written first. Or, plate line 210 may be biased to ground to write a logic 1. This is discussed in more detail below.

Memory cell 105-*c* may be one of a plurality of memory cells 105. Each memory cell 105 of the plurality may be in electronic communication with the charge mirror 405-*a*. A specific memory cell 105 may be connected to charge mirror 405-*a* (and thus to sense component 125-*c*) through column switches 575. For example, column switch 575 may be positioned between memory cell 105-*c* and charge mirror 405-*a*. A column switch 575 may be positioned between each memory cell 105 and charge mirror 405-*a*, for example, column switch 575-*n* may be associated with the $n^{th}$ memory cell 105.

Figure 6:
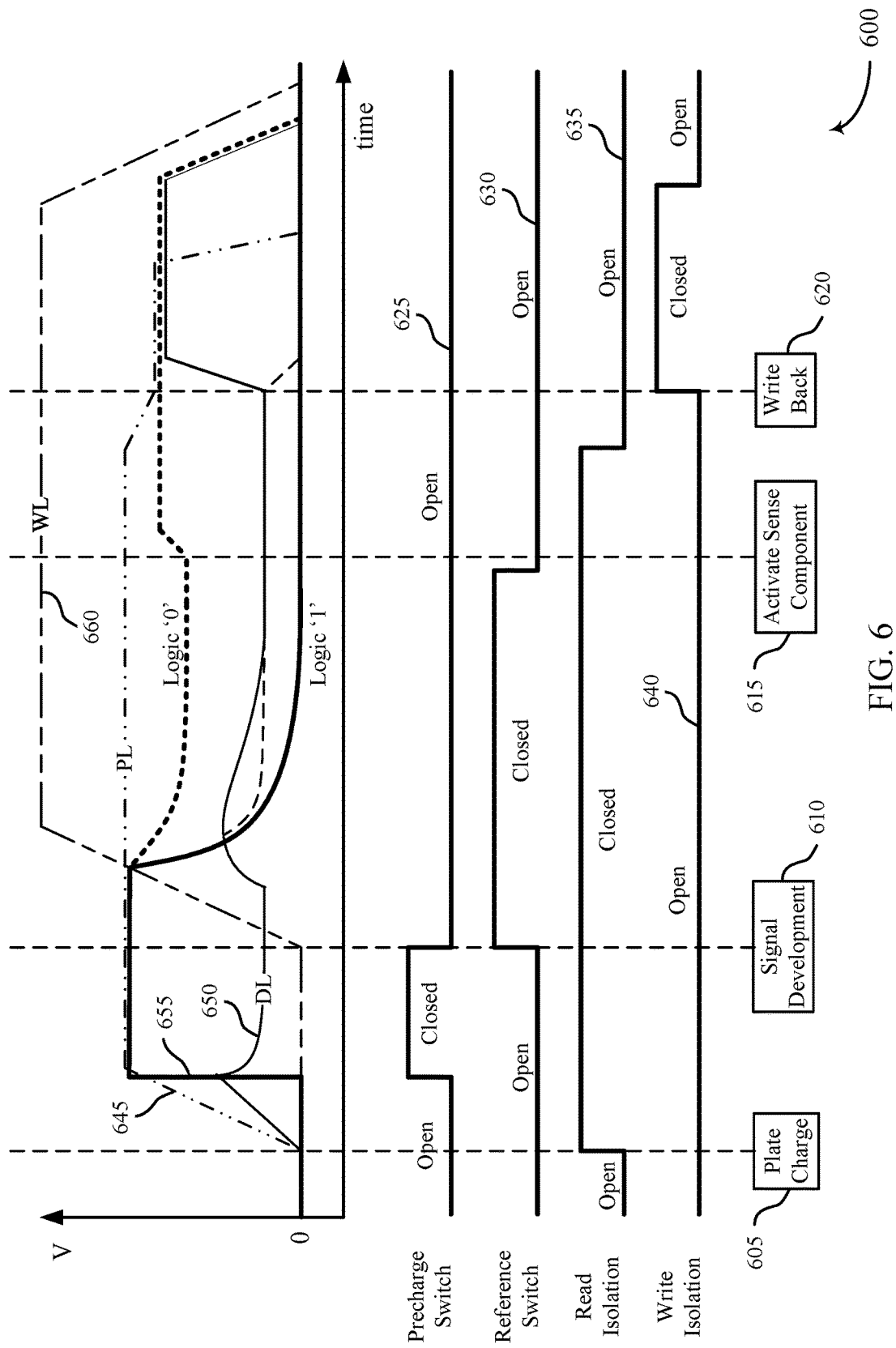
FIG. 6 illustrates an example timing diagram of a charge mirror-based sensing scheme for a ferroelectric memory cell according to various embodiments of the present disclosure.

FIG. 6 illustrates an example timing diagram 600 of a charge mirror-based sensing scheme for ferroelectric memory according to various embodiments of the present disclosure. Timing diagram 600 may represent the operation of circuit 500 with reference to FIG. 5. As discussed below, timing diagram 600 illustrates various voltages as a function of time in order to perform a sense operation on a memory cell 105. Plate line voltage and word line voltage 660 may be examples of a voltage applied to a plate line 210 and word line 110, respectively, with reference to FIG. 1, 2, 4, or 5. Digit line voltage 650 may represent the voltage of a digit line 115 in electronic communication with the memory cell 105. Amplification capacitor voltage 655 may be the voltage of an amplification capacitor 410 with reference to FIGS. 4 and 5. The state of various switches—open or closed—are also depicted in FIG. 6.

At step 605, the cell plate of the ferroelectric memory cell 105 may be charged. Read isolation switches 635 may be closed, which may electrically connect a charge mirror 405 to the memory cell 105 and a sense component 125. Closing read isolation switches 635 may include applying a voltage to read isolation device 550 and transistor 515 with reference to FIG. 5, where the voltage is equal to or greater than the threshold voltage of read isolation device 550 and transistor 515.

Also at step 605, plate voltage 645 may be increased to a non-zero value. In some examples, the final plate voltage 645 may be equal to the cell bias voltage plus a threshold voltage associated with a transistor, as discussed with reference to FIGS. 3 and 5. Thus, a voltage may be applied to a ferroelectric capacitor 205 of the ferroelectric memory cell 105, where the ferroelectric memory cell 105 may be selected (step 610) after applying the voltage to the ferroelectric capacitor 205. In some examples, digit line voltage 650 may increase in response to plate voltage 645 because the digit line 115 may be electrically coupled to the plate of the memory cell 105.

Step 605 may also include precharging an amplification capacitor 410. For example, precharge switch 625 may be closed, which may correspond to closing precharge switch 535 with reference to FIG. 5. This may electrically connect a voltage source to the amplification capacitor 410, resulting in an increase in amplification capacitor voltage 655. In other words, a voltage may be applied to the amplification capacitor 410, where the charge stored in the amplification capacitor 410 is based on the applied voltage to the amplification capacitor 410. In some examples, during step 605, digit line voltage 650 may settle at the transistor threshold voltage, as discussed in FIG. 5.

At step 610, a signal may develop in amplification capacitor 410 based on the stored logic state of the memory cell 105. Precharge switch 625 may be placed in an open state to electrically isolate the amplification capacitor 410 from the precharge voltage. Reference switch 630 may be closed in order to provide a reference signal to the sense component 125. For example, reference switch 545 with reference to FIG. 5 may be closed.

Also at step 610, a voltage may be applied to the word line 110 in electronic communication with the memory cell 105, as shown by the increasing word line voltage 660. The word line voltage 660 may activate a selection component 220 associated with memory cell 105 and may electrically connect memory cell 105 to the digit line 115. In response, charge may flow from the capacitor 205 of memory cell 105 through the charge mirror 405. Due to charge mirror 405, charge is extracted from amplification capacitor 410. Thus, a ferroelectric memory cell 105 may be selected for a sensing operation, where the ferroelectric memory cell 105 is in electronic communication with an amplification capacitor 410 through a charge mirror 405, and at least a portion of a charge stored in the ferroelectric memory cell 105 may be extracted through the charge mirror 405 based on selecting the ferroelectric memory cell 105. At least a portion of a charge stored in the amplification capacitor 410 may also be extracted through the charge mirror 405 based on extracting the portion of the charge stored in the ferroelectric memory cell 105. In some examples, the ferroelectric memory cell 105 may be selected after charging the amplification capacitor 410.

The amount of extracted charge and thus the decrease in amplification capacitor voltage 655 depends on the stored logic state of the memory cell 105. That is, the portion of the charge extracted from the amplification capacitor 410 is based on a logic state of the ferroelectric memory cell 105. As depicted in FIG. 6, amplification capacitor voltage 655 follows the dashed line when a logic 0 is stored. If a logic 1 is stored, amplification capacitor voltage 655 follows the related solid line. Because the read operation (i.e., plate charging) of a logic 1 results in a larger change in charge compared to a logic 0, the charge extracted from the amplification capacitor 410 for a stored logic 1 is larger—thus, amplification capacitor voltage 655 decreases to a lower voltage compared to a logic 0. In some examples, the portion of the charge extracted from the amplification capacitor 410 is based on a mirror ratio 530 of the charge mirror 405.

The resulting digit line voltage 650 is also shown. The solid line corresponds to its response to a logic 1, and the dashed line shows its response to a logic 0. The increase in digit line voltage 650 may result from the charge moving from the memory cell 105 to virtual ground 415 through charge mirror 405.

Prior to activating the sense component 125 at step 615, reference switch 630 may be opened in order to isolate the reference voltage source from sense component 125. During step 615, the sense component 125 may be activated by electrically connecting it to a voltage source and a virtual ground, for example, sense component supply voltage 565 and sense component ground 570, respectively, with reference to FIG. 5. The logic state of memory cell 105 may be determined at step 615. That is, a voltage of the amplification capacitor 410 may be compared to a reference 225 voltage, where the voltage of amplification capacitor 410 is based on the portion of the charge extracted from the amplification capacitor 410. In some cases, comparing the voltage of the amplification capacitor 410 to the reference 225 voltage includes activating a sense amplifier.

After the sense component 125 has been activated, plate line voltage 645 may be decreased to the cell bias voltage. In some examples, it may be reduced by an amount equal to the transistor threshold voltage. Additionally, read isolation switch 635 may be opened. This may electrically isolate the memory cell 105 from the charge mirror 405 in preparation for a write-back operation. In other words, opening read isolation switch 635 may electrically isolate the ferroelectric memory cell 105 from the charge mirror 405.

At step 620, the detected logic value may be written back to the memory cell 105. That is, a write-back operation may be performed on the ferroelectric memory cell 105 based on comparing the voltage of the amplification capacitor 410 to the reference 225 voltage. The write isolation switch 640 may be closed, for example, write isolation device 555 may be activated such that a conductive path is created between the output of sense component 125 and memory cell 105. This may include, in the case that isolation device 555 is a transistor, applying a voltage to isolation device 555 that is equal to or greater than its threshold voltage. In some examples, closing write isolation switch 640 may electrically connect nodes 560 with reference to FIG. 5.

During the write-back operation, the digit line 115 may be biased to the output voltage of the sense component 125 (e.g., node 560 with reference to FIG. 5), that is, if a logic 1 was detected, the digit line voltage 650 is taken high (solid line) and if a logic 0 was detected, digit line voltage 650 is taken low (dashed line). As discussed with reference to FIG. 3, a logic 1 may be written by applying a negative voltage to the memory cell 105. After detecting a logic 1 at step 620, digit line voltage 650 is taken high and is approximately equal to the plate voltage 645, and the net voltage applied to the memory cell 105 is zero. However, during step 620 the plate line voltage 645 is decreased to zero while digit line voltage 650 is held constant, at which point a negative voltage is applied to memory cell 105 and thus a logic 1 is programmed.

A logic 0 may be programmed by applying a positive voltage to the memory cell 105. For a sensed logic 0, the sense component 125 output (e.g., node 560 with reference to FIG. 5) is low, and digit line voltage 650 is taken low, for example, to ground. Because the plate line voltage 645 is high and the digit line voltage 650 is low, a net positive voltage is applied to the memory cell 105, thus writing back a logic 0.

After the write-back operation, write isolation switch 640 may be opened again. For example, the voltage applied to write isolation device 555 may be removed. The digit line 115 and amplification capacitor 410 may be taken to zero voltage, as well as word line voltage 660.

Figure 7:
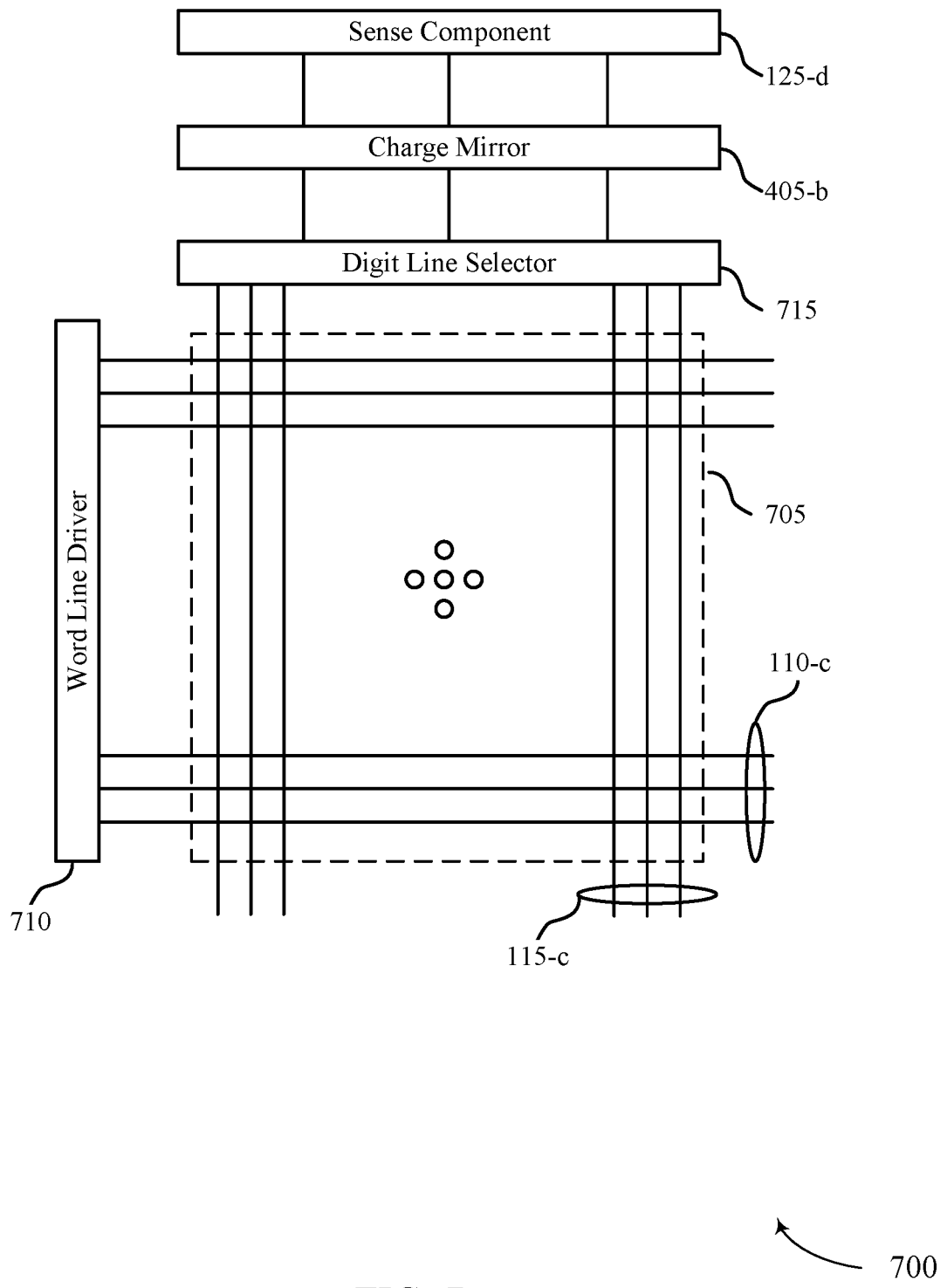
FIG. 7 illustrates an example memory array that supports a charge mirror-based sensing scheme for a ferroelectric memory cell in accordance with various embodiments of the present disclosure.

FIG. 7 illustrates an example memory array 700 that supports a charge mirror-based sensing scheme for ferroelectric memory in accordance with various embodiments of the present disclosure. Memory array 700 may be an example of a memory array 100 with reference to FIG. 1. Memory array 700 includes a memory tile 705, which includes digit lines 115-c and word lines 110-c and their associated memory cells 105. Memory array 700 may include multiple memory tiles 705. A word line driver 710, which may be an example of a row decoder 120 with reference to FIG. 1, is in electronic communication with word lines 110-c. Digit lines 115-c are in electronic communication with digit line selector 715. Digit line selector 715 may be an example of column switches 575-575-n with reference to FIG. 5. Memory array 700 also includes a charge mirror 405-b, which may be an example of a charge mirror 405 with reference to FIGS. 4 and 5. Memory array 700 further includes a sense component 125-c, which may be an example of a sense component 125 with reference to FIGS. 1, 2, 4, and 5.

Digit line selector 715 may control which digit line 115-c—and which memory cell 105—is electrically connected to sense component 125-d. Thus, digit line selector 715 may place a digit line 115-c in electronic communication with charge mirror 405-b. Sense component 125-d may be in electronic communication with charge mirror 405-b and may determine the stored logic state of the memory cell 105 based on charge mirror 405-b. For example, charge mirror 405-b may include transistors and an amplification capacitor 410, as described with reference to FIGS. 4 and 5, which may produce a signal read by sense component 125-d to determine the stored logic state. In some examples, a higher mirror ratio 530 of charge mirror 405-b may be used to reduce the capacitance size, which may reduce power and occupied die area, as well as reduce loss due to noise.

Memory array 700 may represent a high performance device because each memory tile 705 may be connected to a single sense component 125. For example, as depicted, sense component 125-d is in electronic communication with memory tile 705.

Thus, Memory array 700 may include multiple memory tiles 705, where each memory tiles includes multiple rows of ferroelectric memory cells and multiple columns of ferroelectric memory cells. Memory array 700 may also include multiple charge mirrors 405, where each memory tile 705 is in electronic communication with at least one charge mirror 405. In some examples, each column of each of the memory tiles 705 comprises a common digit line 115 that is in electronic communication with the at least one charge mirror 405-b. In further examples, sense component 125-d may be in electronic communication with charge mirror 405-b and a plurality of cascode devices, where each cascode device of the plurality may act as a switch between sense component 125-d and at least one charge mirror of the plurality of charge mirrors.

Figure 8:
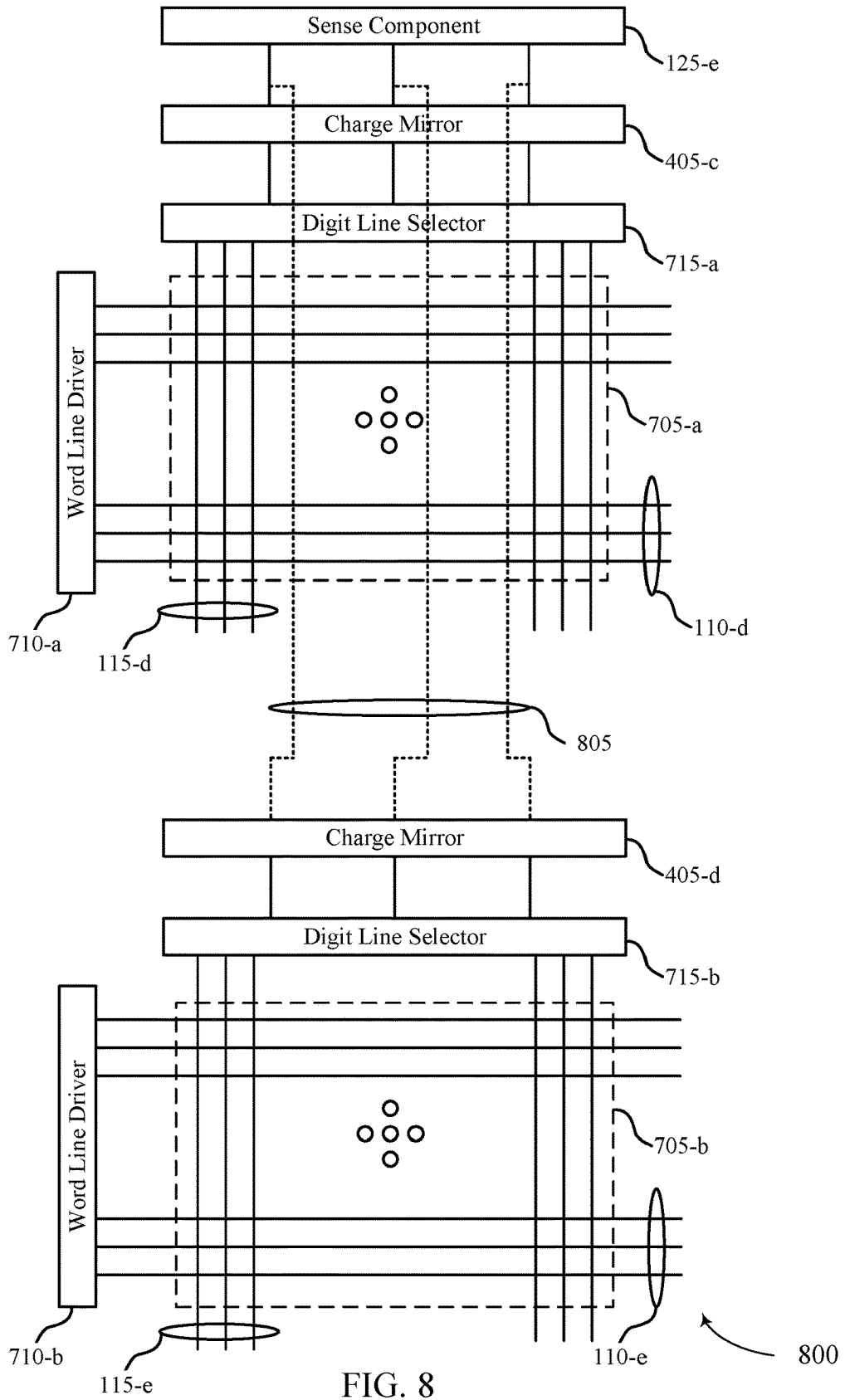
FIG. 8 illustrates an example memory array that supports a charge mirror-based sensing scheme for a ferroelectric memory cell in accordance with various embodiments of the present disclosure.

FIG. 8 illustrates an example memory array 800 that supports a charge mirror-based sensing scheme for ferroelectric memory in accordance with various embodiments of the present disclosure. Memory array 800 may be an example of a memory array 100 or 700 with reference to FIGS. 1 and 7. Memory array 800 includes a memory tiles 705-a and 705-b, which may be an example of memory tile 705 with reference to FIG. 7. Memory tiles 705-a and 705-b may be in electronic communication with a single sense component, such as sense component 125-e, which may be an example of a sense component 125 with reference to FIGS. 1, 2, 4, 5, and 7. Memory array 800 also includes charge mirrors 405-c and 405-d, which may be examples of a charge mirror 405 with reference to FIGS. 2, 4, 5, and 7. Memory array 800 includes word line drivers 710-a and 710-b and digit line selectors 715-a and 715-b, which may be examples of a word line driver 710 and a digit line selector 715, respectively, with reference to FIG. 7. Memory array also includes conductive lines 805, which may electrically connect charge mirror 405-d of memory tile 705-b to sense component 125-e.

Memory tile 705-a includes digit lines 115-d and word lines 110-d and their associated memory cells 105. Word line driver 710-a is in electronic communication with word lines 110-d, and digit line selector 715-a is in electronic communication with digit lines 115-d. Memory tile 705-b includes digit lines 115-d and word lines 110-d and their associated memory cells 105. Word line driver 710-b is in electronic communication with word lines 110-e, and digit line selector 715-b is in electronic communication with digit lines 115-e.

Each memory tile 705 has a charge mirror 405. For example, charge mirror 405-c is in electronic communication with tile 705-a through digit line selector 715-a, and charge mirror 405-d is in electronic communication with 705-b through digit line selector 715-b. Both charge mirror 405-c and 405-d may include a cascode device 515, as described with reference to FIG. 5. Cascode device 515 may act as a tile switch—it may electrically connect memory tile 705-a or 705-b to sense component 125-e.

Charge mirror 405-d of memory tile 705-b may be in electronic communication with sense component 125-e through conductive lines 805. In some examples, conductive lines 805 may replace the amplification capacitor 410 of the charge mirror 405. For example, conductive lines 805 may have a parasitic capacitance that depends on their dimensions—including their length—as described with reference to FIG. 5.

Memory array 800 may be an example of a cost-sensitive device. For example, by associating multiple memory tiles 705 with a single sense component 125, fewer sense components 125 are needed for memory array 800. Although depicted with two memory tiles 705 connected to sense component 125-e, more than two may be possible.

Thus, memory array 800 may include a plurality of memory tiles 705, the memory tiles each including a plurality of rows of ferroelectric memory cells and a plurality of columns of ferroelectric memory cells. Memory array 800 may also include a plurality of charge mirrors 405, where each memory tile 705 of the plurality is in electronic communication with at least one charge mirror 405 of the plurality. In some examples, each column of the plurality of columns of each of the memory tiles 705 is a common digit line 115 that is in electronic communication with the at least one charge mirror 405. In further examples, memory array 800 may include a plurality of sense components 125, where each sense component 125 of the plurality is in electronic communication with at least one charge mirror 405 of the plurality. Memory array 800 may also include a plurality of cascode devices 515, where each cascode device 515 of the plurality comprises a switch between each sense component 125 of the plurality and the at least one charge mirror 405.

Figure 9:
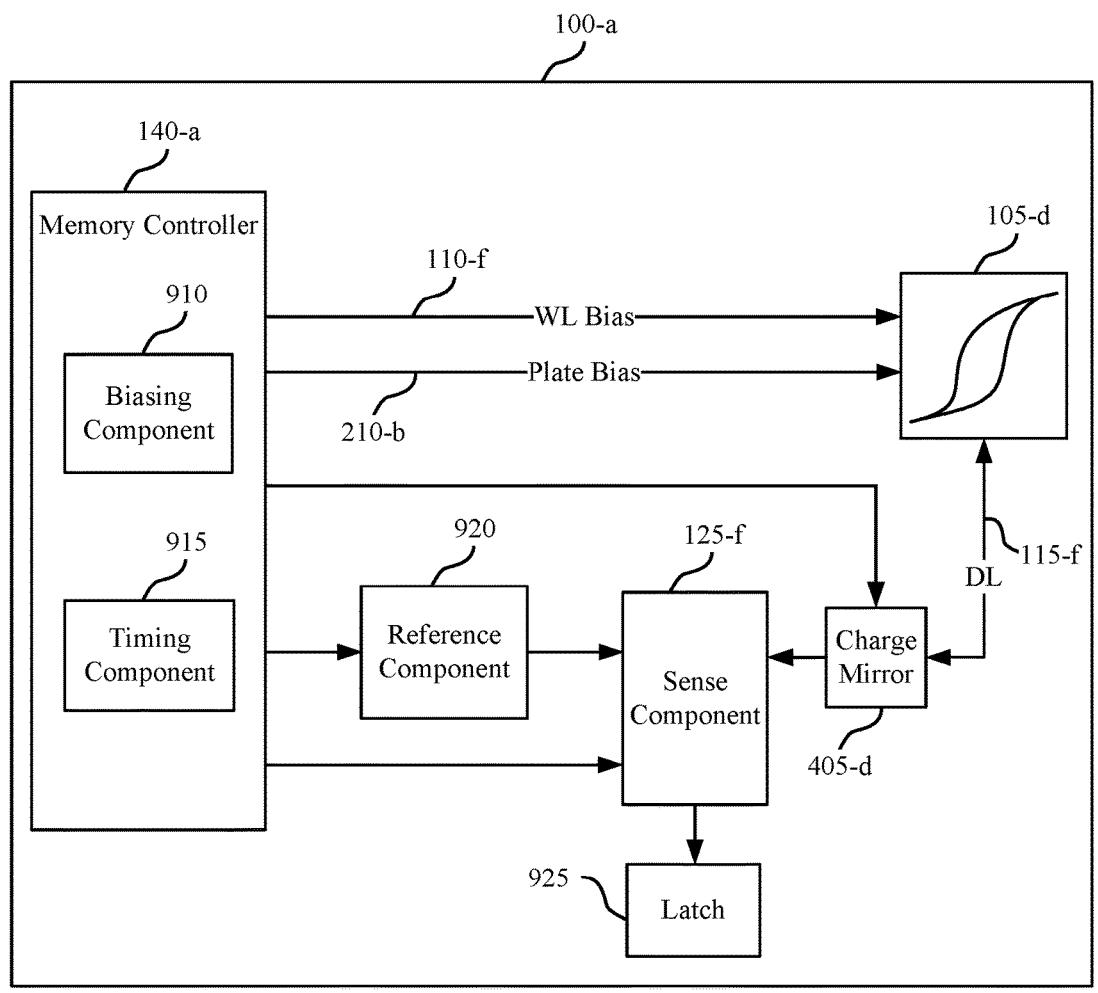
FIG. 9 illustrates a block diagram of an example ferroelectric memory array that supports a charge mirror-based sensing scheme for ferroelectric memory in accordance with various embodiments of the present disclosure.

FIG. 9 shows a block diagram 900 of a memory array 100-a that supports a charge mirror-based sensing scheme for ferroelectric memory in accordance with various embodiments of the present disclosure. Memory array 100-*a* may be referred to as an electronic memory apparatus and includes memory controller 140-*a* and memory cell 105-*d*, which may be examples of memory controller 140 and memory cell 105 described with reference to FIGS. 1, 2, 4, and 5. Memory array 100-*a* may be example of memory array 100, 500, 700, or 800 with reference to FIGS. 1, 5, 7, and 8.

Memory controller 140-*a* may include biasing component 910 and timing component 915 and may operate memory array 100-*a* as described in FIGS. 1-4 and 6-8. Memory controller 140-*a* may be in electronic communication with word line 110-*f*, digit line 115-*f*, sense component 125-*f*, and plate line 210-*b*, which may be examples of word line 110, digit line 115, sense component 125, and plate line 210 described with reference to FIG. 1, 2, 4, 5, 7, or 8. Memory controller 140-*a* may be in electronic communication with charge mirror 405-*d*, which may be an example of a charge mirror 405 with reference to FIGS. 4, 5, 7, and 8. Memory array 100-*a* may also include reference component 920 and latch 925. The components of memory array 100-*a* may be in electronic communication with each other and may perform the functions described with reference to FIGS. 1-8. In some cases, reference component 920, sense component 125-*f* and latch 925 may be components of memory controller 140-*a*.

Memory controller 140-*a* may be configured to activate word line 110-*f*, plate 210-*b*, or digit line 115-*f* by applying voltages to those various nodes. For example, biasing component 910 may be configured to apply a voltage to operate memory cell 105-*d* to read or write memory cell 105-*d* as described above. In some cases, memory controller 140-*a* may include a row decoder, column decoder, or both, as described with reference to FIG. 1. This may enable memory controller 140-*a* to access one or more memory cells 105. Biasing component 910 may also provide voltages to reference component 920 in order to generate a reference signal for sense component 125-*f*. Additionally, biasing component 910 may provide voltage potentials for the operation of sense component 125-*f*. Biasing component 910 may also provide voltages for the operation of charge mirror 405-*d*, for example, by activating switches to electrically connect memory cell 105-*d* to charge mirror 405-*d*.

In some cases, memory controller 140-*a* may perform its operations using timing component 915. For example, timing component 915 may control the timing of the various word line selections or plate biasing, including timing for switching and voltage application to perform the memory functions, such as reading and writing, discussed herein. For example, timing component 915 may apply the voltages and control the switches described in FIG. 6. In some cases, timing component 915 may control the operations of biasing component 910.

Reference component 920 may include various components to generate a reference signal for sense component 125-*a*. Reference component 920 may include circuitry configured to produce a reference signal. In some cases, reference component 920 may be other ferroelectric memory cells 105. In other cases, it may be a voltage source. In some examples, reference component 920 may be configured to output a voltage with a value between the two sense voltages, as described with reference to FIG. 3. For example, reference component 920 may generate a voltage between the two resulting voltages of an amplification capacitor 410.

Sense component 125-*a* may compare a signal from memory cell 105-*d* (through digit line 115-*f*) with a reference signal from reference component 920. Upon determining the logic state, the sense component may then store the output in latch 925, where it may be used in accordance with the operations of an electronic device that memory array 100-*a* is a part. Memory controller 140-*a* may also perform a write-back operation to memory cell 105-*d* based on the determined logic state.

Thus, memory array 100-*a* includes a charge mirror 405-*d*, which may include an amplification capacitor 410 in electronic communication with ferroelectric memory cell 105-*d* through the charge mirror 405-*d*, sense component 125-*f* in electronic communication with the amplification capacitor, and memory controller 140-*a*. Memory controller 140-*a* may be operable to electrically connect the amplification capacitor to the charge mirror 405-*d*, apply a voltage to the ferroelectric memory cell 105-*d*, electrically connect the ferroelectric memory cell 105-*d* to charge mirror 405-*d*, and activate sense component 125-*f*. In some examples, memory controller 140-*a* may apply a voltage to the amplification capacitor. In some examples, electrically connecting the amplification capacitor to charge mirror 405-*d* is based on applying the voltage to the amplification capacitor.

Figure 10:
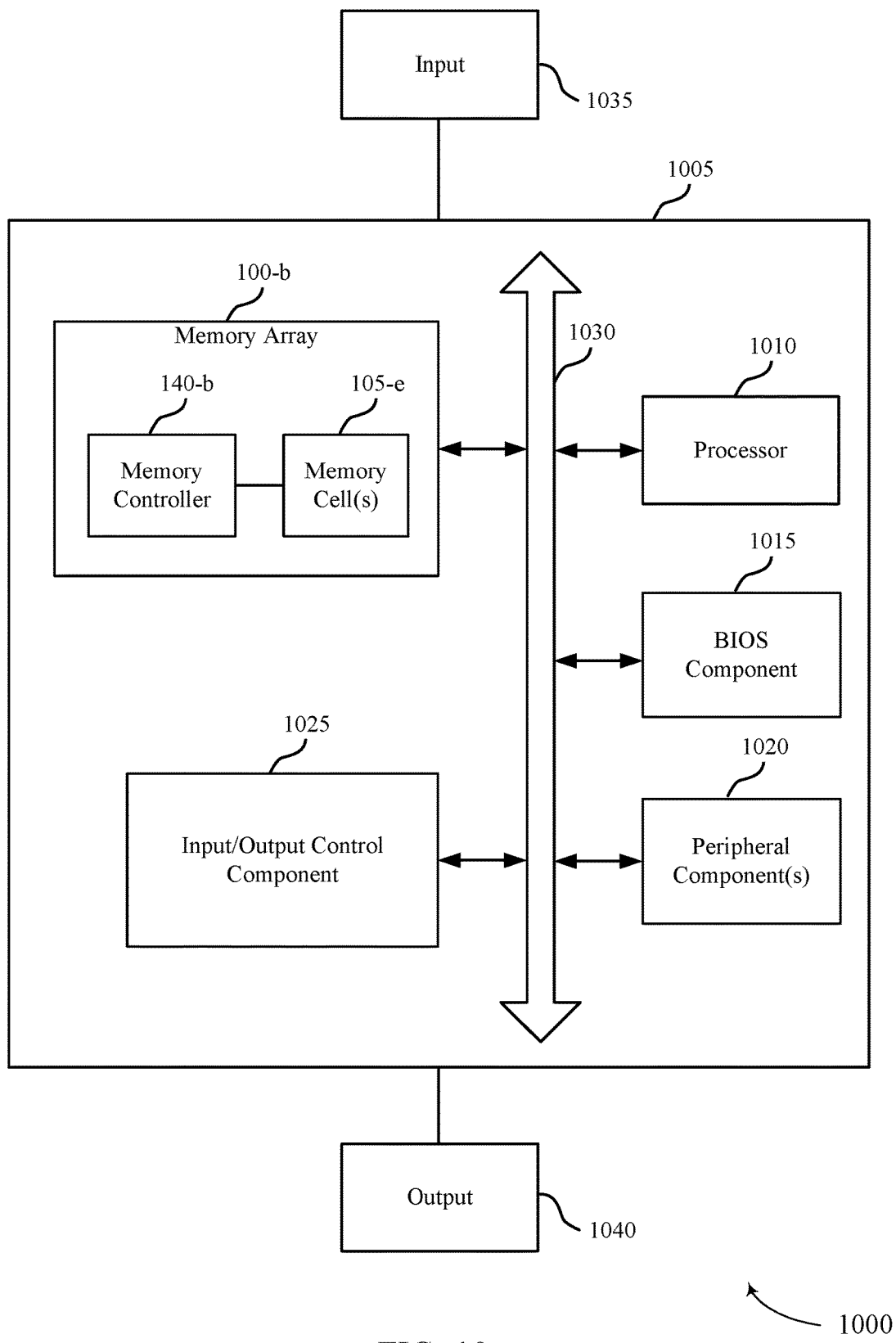
FIG. 10 illustrates a system, including a memory array, that supports a charge mirror-based sensing scheme for ferroelectric memory in accordance with various embodiments of the present disclosure.

FIG. 10 illustrates a system 1000 that supports a charge mirror-based sensing scheme for ferroelectric memory in accordance with various embodiments of the present disclosure. System 1000 includes a device 1005, which may be or include a printed circuit board to connect or physically support various components. Device 1005 includes a memory array 100-*b*, which may be an example of memory array 100, 100-*a*, 500, 700, or 800 as described with reference to FIGS. 1, 5, and 7-9. Memory array 100-*b* may contain memory controller 140-*b* and memory cell(s) 105-*e*, which may be examples of memory controller 140 described with reference to FIGS. 1 and 9 and memory cells 105 described with reference to FIGS. 1, 2, 4, 5, and 9. Device 1005 may also include a processor 1010, BIOS component 1015, peripheral component(s) 1020, and input/output control component 1025. The components of device 1005 may be in electronic communication with one another through bus 1030.

Processor 1010 may be configured to operate memory array 100-*b* through memory controller 140-*b*. In some cases, processor 1010 may perform the functions of memory controller 140 described with reference to FIGS. 1-4 and 6-9. In other cases, memory controller 140-*b* may be integrated into processor 1010. Processor 1010 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 1010 may perform various functions described herein, including a charge mirror-based sensing scheme for ferroelectric memory. Processor 1010 may, for example, be configured to execute computer-readable instructions stored in memory array 100-*b* to cause device 1005 perform various functions or tasks.

BIOS component 1015 may be a software component that includes a basic input/output system (BIOS) operated as firmware, which may initialize and run various hardware components of system 1000. BIOS component 1015 may also manage data flow between processor 1010 and the various components, e.g., peripheral components 1020, input/output control component 1025, etc. BIOS component 1015 may include a program or software stored in read-only memory (ROM), flash memory, or any other non-volatile memory.

Peripheral component(s) 1020 may be any input or output device, or an interface for such devices, that is integrated into device 1005. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 1025 may manage data communication between processor 1010 and peripheral component(s) 1020, input 1035 devices, or output 1040 devices. Input/output control component 1025 may also manage peripherals not integrated into device 1005. In some cases, input/output control component 1025 may represent a physical connection or port to the external peripheral.

Input 1035 may represent a device or signal external to device 1005 that provides input to device 1005 or its components. This may include a user interface or interface with or between other devices. In some cases, input 1035 may be a peripheral that interfaces with device 1005 via peripheral component(s) 1020 or may be managed by input/output control component 1025.

Output 1040 may represent a device or signal external to device 1005 configured to receive output from device 1005 or any of its components. Examples of output 1040 may include a display, audio speakers, a printing device, another processor or printed circuit board, etc. In some cases, output 1040 may be a peripheral that interfaces with device 1005 via peripheral component(s) 1020 or may be managed by input/output control component 1025.

The components of memory controller 140-b, device 1005, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 11:
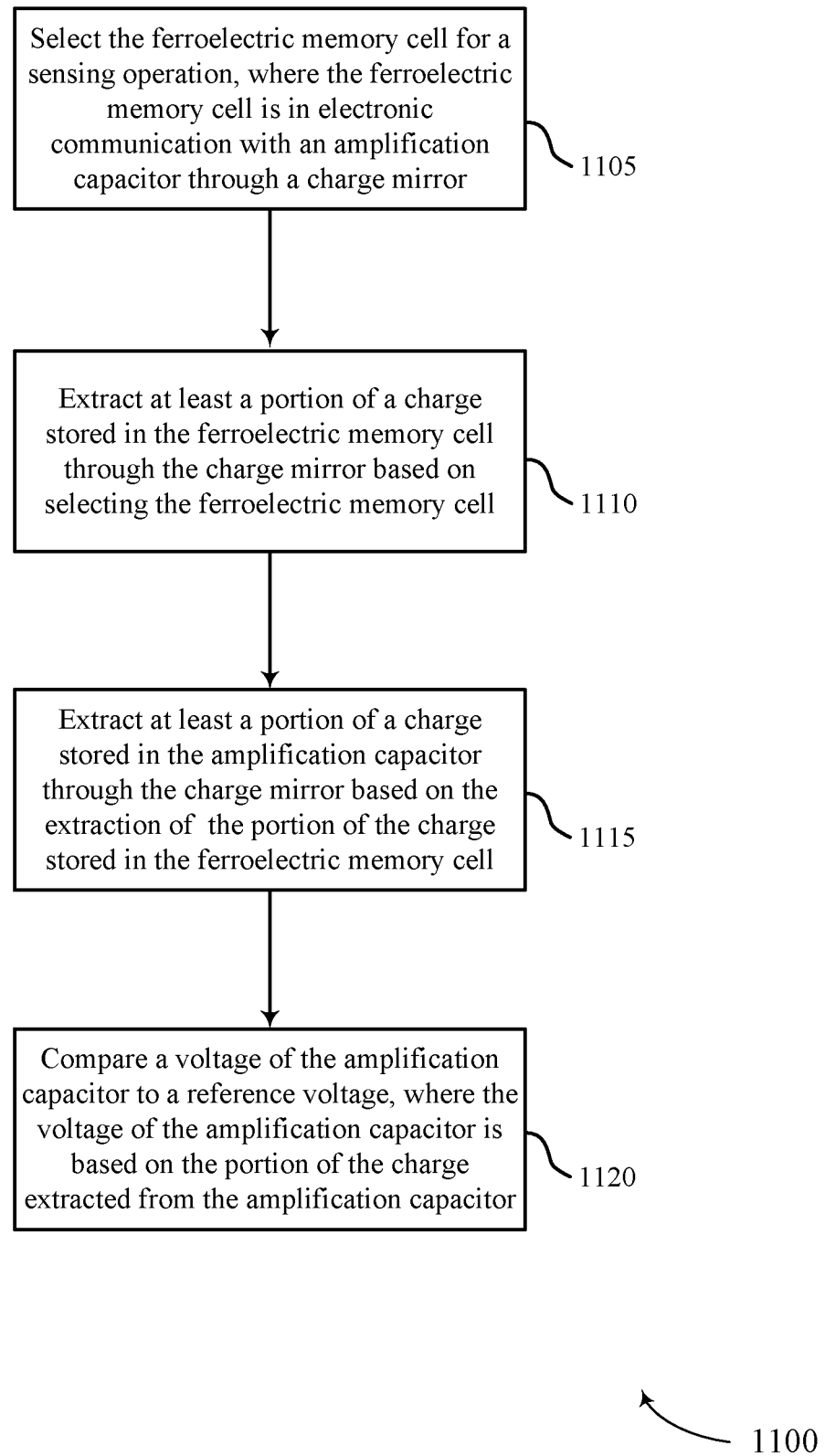
FIG. 11 is a flowchart that illustrates a method for operating a charge mirror-based sensing scheme for ferroelectric memory in accordance with various embodiments of the present disclosure.

FIG. 11 shows a flowchart illustrating a method 1100 for operating a charge mirror-based sensing scheme for ferroelectric memory in accordance with various embodiments of the present disclosure. The operations of method 1100 may be implemented by a memory array 100, as described with reference to FIGS. 1, 5, 7-10. For example, the operations of method 1100 may be performed by a memory controller 140 as described with reference to FIGS. 1, 8, and 9. In some examples, a memory controller 140 may execute a set of codes to control the functional elements of the memory array 100 to perform the functions described below. Additionally or alternatively, the memory controller 140 may perform features the functions described below using special-purpose hardware.

At block 1105, the method may include selecting a ferroelectric memory cell for a sensing operation, where the ferroelectric memory cell is in electronic communication with an amplification capacitor through a charge mirror, as described with reference to FIGS. 1, 2, and 4-8. In certain examples, the operations of block 1105 may be performed or facilitated by the memory controller 140, as described with reference to FIGS. 1, 8, and 9.

At block 1110, the method may include extracting at least a portion of a charge stored in the ferroelectric memory cell through the charge mirror based on selecting the ferroelectric memory cell, as described with reference to FIGS. 1-6. In certain examples, the operations of block 1110 may be performed or facilitated by the memory controller 140, as described with reference to FIGS. 1, 8, and 9, as well as charge mirror 405, as described with reference to FIGS. 4, 5, and 6.

At block 1115, the method may include extracting at least a portion of a charge stored in the amplification capacitor through the charge mirror based on the extraction of the portion of the charge stored in the ferroelectric memory cell, as described with reference to FIGS. 1-6. In some examples, the portion of the charge extracted from the amplification capacitor is based on a logic state of the ferroelectric memory cell. In some cases, the portion of the charge extracted from the amplification capacitor is based on a mirror ratio of the charge mirror. In certain examples, the operations of block 1115 may be performed or facilitated by the memory controller 140, as described with reference to FIGS. 1, 8, and 9, as well as the charge mirror 405 and amplification capacitor 410, as described with reference to FIGS. 4, 5, and 6.

At block 1120, the method may include comparing a voltage of the amplification capacitor to a reference voltage, where the voltage of the amplification capacitor is on the portion of the charge extracted from the amplification capacitor, as described with reference to FIGS. 1-6. In certain examples, the operations of block 1120 may be performed or facilitated by the memory controller 140, as described with reference to FIGS. 1, 8, and 9, and sense component 125 as described with reference to FIGS. 1, 2, and 4-9.

In some examples, the method may include applying a voltage to the amplification capacitor, where the charge stored in the amplification capacitor is based on the applied voltage to the amplification capacitor, and selecting the ferroelectric memory cell after charging the amplification capacitor. The method may also include applying a voltage to a ferroelectric capacitor of the ferroelectric memory cell. In some cases, the ferroelectric memory cell is selected after applying the voltage to the ferroelectric capacitor.

The method may also include electrically isolating the ferroelectric memory cell from the charge mirror and performing a write-back operation to the ferroelectric memory cell based on comparing the voltage of the amplification capacitor to the reference voltage. In some examples, comparing the voltage of the amplification capacitor to the reference voltage includes activating a sense amplifier.

Thus, method 1100 may provide for a charge mirror-based sensing scheme for ferroelectric memory and may be a method of operating a ferroelectric memory cell. It should be noted that method 1100 describe possible implementations, and the operations and steps may be rearranged or otherwise modified such that other implementations are possible The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of operating a memory cell, comprising:
   extracting a first charge stored in the memory cell through a charge mirror;
   extracting a second charge stored in an amplification capacitor through the charge mirror based at least in part on extracting the first charge stored in the memory cell, wherein the amplification capacitor is in coupled with the memory cell via the charge mirror; and
   comparing a voltage associated with the amplification capacitor to a reference voltage, wherein the voltage of the amplification capacitor is based at least in part on the second charge being extracted from the amplification capacitor.

2. The method of claim 1, further comprising:
   applying a second voltage to the amplification capacitor by discharging the memory cell, and wherein the second charge stored in the amplification capacitor is based at least in part on applying the second voltage to the amplification capacitor.

3. The method of claim 1, further comprising:
   isolating the memory cell from the charge mirror; and
   performing a write-back operation on the memory cell based at least in part on comparing the voltage of the amplification capacitor to the reference voltage and isolating the memory cell from the charge mirror.

4. The method of claim 1, wherein the second charge extracted from the amplification capacitor is based at least in part on a ratio associated with the charge mirror.

5. The method of claim 4, wherein the ratio is based at least in part on a ratio of channel widths of a plurality of transistors associated with the charge mirror.

6. The method of claim 1, wherein comparing the voltage of the amplification capacitor to the reference voltage comprises:
   activating a sense amplifier, wherein the sense amplifier is configured to apply an output voltage to the amplification capacitor based at least in part on comparing the voltage of the amplification capacitor with the reference voltage.

7. An apparatus, comprising:
   a memory cell;
   a charge mirror coupled with the memory cell;
   an amplification capacitor coupled with the charge mirror;
   a first isolation device coupled with the memory cell and the charge mirror; and
   a second isolation device coupled with a sense component that is coupled with the amplification capacitor and the charge mirror.

8. The apparatus of claim 7, wherein the sense component is configured to compare a voltage of the amplification capacitor with a reference signal, and wherein the voltage of the amplification capacitor is based at least in part on a charge being extracted from the amplification capacitor through the charge mirror.

9. The apparatus of claim 8, wherein comparing the voltage of the amplification capacitor with the reference signal comprises:
   activating a sense amplifier based at least in part on the sense amplifier receiving the reference signal.

10. The apparatus of claim 7, wherein:
    the first isolation device and the second isolation device are arranged in a cascode configuration.

11. The apparatus of claim 7, wherein the charge mirror comprises:
    a first transistor and a second transistor arranged in a cascode configuration, wherein a terminal of the first transistor is coupled with the memory cell and a terminal of the second transistor is coupled with a virtual ground.

12. The apparatus of claim 7, further comprising:
    a reference component coupled with the sense component and a voltage source, wherein the reference component is configured to generate a reference signal based at least in part on receiving a voltage from the voltage source.

13. The apparatus of claim 7, further comprising:
    a sense amplifier coupled with the amplification capacitor, wherein the sense amplifier is configured to compare a voltage associated the amplification capacitor to a reference signal based at least in part on the memory cell being isolated from the charge mirror.

14. The apparatus of claim 7, wherein the memory cell and the amplification capacitor comprise a dielectric capacitor, a parasitic capacitor, or a ferroelectric capacitor, or a combination thereof.

15. An apparatus, comprising:
    a memory cell;
    a charge mirror coupled with the memory cell;
    an amplification capacitor coupled with the charge mirror; and
    a controller coupled with the memory cell and operable to:
    extract a first charge stored in the memory cell through the charge mirror;
    extract a second charge stored in the amplification capacitor through the charge mirror based at least in part on extracting the first charge stored in the memory cell; and initiate comparing a voltage associated with the amplification capacitor to a reference voltage based at least in part on extracting the second charge from the amplification capacitor.

16. The apparatus of claim 15, wherein the controller is operable to:
   initiate applying a second voltage to the amplification capacitor; and
   initiate storing the second charge in the amplification capacitor based at least in part on initiating applying the second voltage to the amplification capacitor.

17. The apparatus of claim 15, wherein the second charge extracted from the amplification capacitor is based at least in part on a ratio associated with the charge mirror.

18. The apparatus of claim 15, wherein the controller is operable to:
   activate a transistor to isolate the memory cell from the charge mirror;
   initiate performing a write-back operation to the memory cell based at least in part on isolating the memory cell from the charge mirror; and
   deactivating the transistor based at least in part on the write-back operation being performed.

19. The apparatus of claim 15, wherein the controller is operable to:
   initiate applying an output voltage to the amplification capacitor based at least in part on comparing the voltage of the amplification capacitor to the reference voltage.

20. The apparatus of claim 15, wherein:
   the memory cell comprises a ferroelectric capacitor; and
   the second charge extracted from the amplification capacitor is based at least in part on a charge stored by the ferroelectric capacitor.

\* \* \* \* \*